United States Patent
Deng et al.

(10) Patent No.: US 12,402,392 B2
(45) Date of Patent: Aug. 26, 2025

(54) SEMICONDUCTOR STRUCTURE AND MANUFACTURING METHOD THEREOF

(71) Applicant: Taiwan Semiconductor Manufacturing Co., Ltd., Hsinchu (TW)

(72) Inventors: Jie-Cheng Deng, New Taipei (TW); Horng-Huei Tseng, Hsinchu (TW); Yi-Jen Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 462 days.

(21) Appl. No.: 17/650,950

(22) Filed: Feb. 14, 2022

(65) Prior Publication Data

US 2022/0172997 A1  Jun. 2, 2022

Related U.S. Application Data

(60) Continuation of application No. 16/050,028, filed on Jul. 31, 2018, now Pat. No. 11,251,085, which is a
(Continued)

(51) Int. Cl.
| | |
|---|---|
| *H10D 30/62* | (2025.01) |
| *H01L 21/033* | (2006.01) |
| *H01L 21/311* | (2006.01) |
| *H01L 21/32* | (2006.01) |
| *H01L 21/3213* | (2006.01) |
| *H10D 64/01* | (2025.01) |
| *H10D 84/01* | (2025.01) |

(Continued)

(52) U.S. Cl.
CPC ....... *H10D 84/038* (2025.01); *H01L 21/0332* (2013.01); *H01L 21/0338* (2013.01); *H01L 21/31144* (2013.01); *H01L 21/32* (2013.01); *H01L 21/32139* (2013.01); *H10D 64/017* (2025.01); *H10D 84/0135* (2025.01); *H10D 84/0151* (2025.01); *H10D 84/0158* (2025.01); *H10D 84/834* (2025.01); *H10D 30/797* (2025.01); *H10D 86/011* (2025.01); *H10D 89/10* (2025.01)

(58) Field of Classification Search
None
See application file for complete search history.

(56) References Cited

U.S. PATENT DOCUMENTS

| | | |
|---|---|---|
| 9,601,492 B1 | 3/2017 | Deng et al. |
| 2014/0191296 A1 | 7/2014 | Bergendahl et al. |

(Continued)

FOREIGN PATENT DOCUMENTS

CN  107039428 A  8/2017

*Primary Examiner* — Steven B Gauthier
*Assistant Examiner* — Lamont B Koo
(74) *Attorney, Agent, or Firm* — Slater Matsil, LLP

(57) ABSTRACT

A semiconductor structure includes a first fin, a second fin, a first gate, a second gate, at least one spacer, and an insulating structure. The first gate is present on the first fin. The second gate is present on the second fin. The spacer is present on at least one side wall of at least one of the first gate and the second gate. The insulating structure is present between the first fin and the second fin, in which the spacer is substantially absent between the insulating structure and said at least one of the first gate and the second gate.

20 Claims, 12 Drawing Sheets

Related U.S. Application Data division of application No. 15/061,876, filed on Mar. 4, 2016, now Pat. No. 10,510,608.

(51) Int. Cl.
    *H10D 84/03*      (2025.01)
    *H10D 84/83*      (2025.01)
    *H10D 30/69*      (2025.01)
    *H10D 86/01*      (2025.01)
    *H10D 89/10*      (2025.01)

(56) References Cited

U.S. PATENT DOCUMENTS

| | | |
|---|---|---|
| 2014/0312398 A1* | 10/2014 | Ching .................. H01L 29/785 |
| | | 257/288 |
| 2015/0054078 A1 | 2/2015 | Xie et al. |
| 2015/0228647 A1 | 8/2015 | Chang et al. |
| 2015/0236131 A1 | 8/2015 | Chang et al. |
| 2015/0255557 A1 | 9/2015 | Zhu et al. |
| 2015/0311311 A1 | 10/2015 | Fumitake |
| 2015/0349094 A1 | 12/2015 | Song et al. |
| 2015/0357434 A1 | 12/2015 | Jang et al. |
| 2016/0093614 A1* | 3/2016 | Cheng ............. H01L 21/823431 |
| | | 438/283 |
| 2016/0111420 A1 | 4/2016 | Zhang et al. |
| 2016/0133632 A1 | 5/2016 | Park et al. |
| 2016/0148935 A1 | 5/2016 | Chen et al. |
| 2016/0276340 A1 | 9/2016 | Chang et al. |
| 2017/0148682 A1 | 5/2017 | Basker et al. |

* cited by examiner

SEMICONDUCTOR STRUCTURE AND MANUFACTURING METHOD THEREOF

PRIORITY CLAIM AND CROSS-REFERENCE

This application is a continuation of U.S. patent application Ser. No. 16/050,028, entitled "Semiconductor Structure and Manufacturing Method Thereof", and filed on Jul. 31, 2018, which is a divisional of U.S. patent application Ser. No. 15/061,876 (now U.S. Pat. No. 10,510,608, issued Dec. 17, 2019), entitled "Semiconductor Structure and Manufacturing Method Thereof," and filed on Mar. 4, 2016, which applications are incorporated herein by reference.

BACKGROUND

Double-gate metal-oxide-semiconductor field-effect transistors (MOSFETs) are MOSFETs that incorporate two gates into one device. These devices are also called fin-shaped field effect transistors (FinFETs) due to their structure including a thin "fin" extending from a substrate. Silicon based FinFETs can be fabricated using MOSFET technology. A FinFET is fabricated on a substrate with an overlying insulating layer with a thin "fin" extending from the substrate, for example, etched into a silicon layer of the substrate. The channel of the field effect transistor (FET) is formed in this vertical fin. A gate is provided over (e.g., wrapping) the fin. The double gate is beneficial in that there is a gate on both sides of the channel allowing gate control of the channel from both sides. Further advantages of FinFETs include reducing the short channel effect and higher current flow. Other FinFET architectures may include three or more effective gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
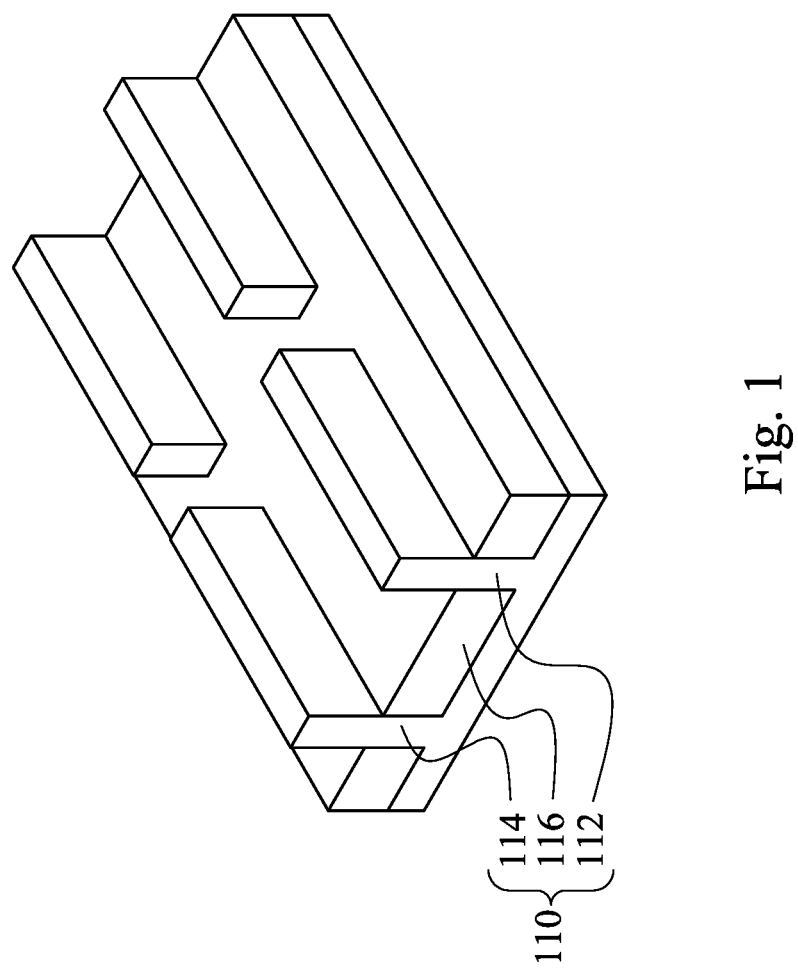
FIGS. 1-12 are perspective views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-12 are perspective views of a method for manufacturing a semiconductor structure 100 at various stages in accordance with some embodiments of the present disclosure.

Reference is made to FIG. 1. A substrate 110 is provided. The substrate 110 includes first fins 112 and second fins 114. In some embodiments, the first fins 112 and the second fins 114 include silicon. It is note that the numbers of the first fins 112 and the second fins 114 in FIG. 1 are illustrative and should not limit various embodiments of the present disclosure. A person having ordinary skill in the art may select suitable numbers for the first fins 112 and the second fins 114 according to actual situations.

In some embodiments, the substrate 110 may be made of a semiconductor material and may include, for example, a graded layer or a buried oxide therein. In some embodiments, the substrate 110 includes bulk silicon that may be undoped or doped (e.g., p-type, n-type, or combinations thereof). Other materials that are suitable for semiconductor device formation may be used. For example, germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

The first fins 112 and the second fins 114 may be formed by, for example, patterning and etching the substrate 110 using photolithography techniques. In some embodiments, a layer of photoresist material (not shown) is formed over the substrate 110. The layer of photoresist material is irradiated (or exposed) in accordance with a pattern (the first fins 112 and the second fins 114) and developed to remove a portion of the photoresist material. The remaining photoresist material protects the underlying material from subsequent processing steps, such as etching. Then, an etching process is performed to form the first fins 112 and the second fins 114. It should be noted that other masks, such as an oxide or silicon nitride mask, may also be used in the etching process.

In some other embodiments, the first fins 112 and the second fins 114 may be epitaxially grown. For example, exposed portions of an underlying material, such as exposed portions of the substrate 110, may be used in an epitaxial process to form the first fins 112 and the second fins 114. A mask may be used to control the shape of the first fins 112 and the second fins 114 during the epitaxial growth process.

The substrate 110 further includes isolation structures 116. The isolation structures 116, which act as shallow trench isolation (STI) structures between the first fins 112 and the second fins 114, may be formed by filling trenches between the first fins 112 and the second fins 114 with a flowable dielectric material, curing the flowable dielectric material, and then recessing the cured dielectric material. In yet some other embodiments, the isolation structures 116 are insulator layers of a SOI wafer.

Figure 2:
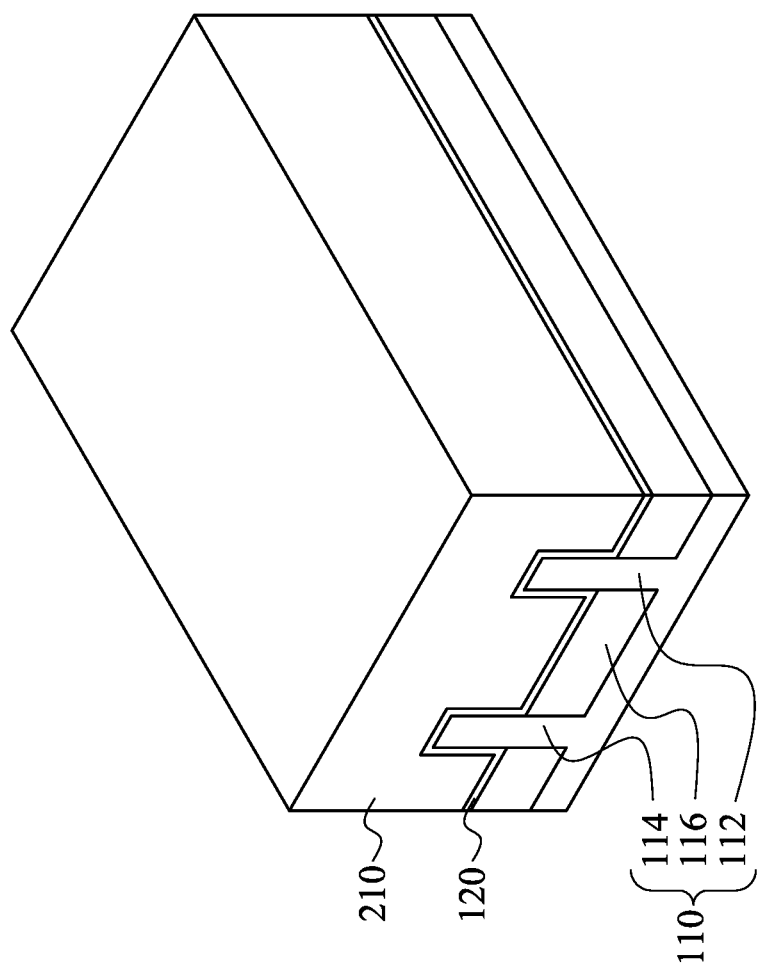

In FIG. 2, an insulating layer 120 is formed over the first fins 112, the second fins 114, and the isolation structures 116. In some embodiments, the insulating layer 120 may be made of silicon nitride. The insulating layer 120 may be formed using chemical vapor deposition (CVD), physical vapor deposition (PVD), atomic layer deposition (ALD), other suitable processes, or combinations thereof. In addition, in some embodiments, the insulating layer 120 and the isolation structures 116 are made of different materials.

Then, a mask layer 210 is formed over the substrate 110 to cover the insulating layer 120. In some embodiments, the mask layer 210 includes a semiconductor material, such as polysilicon or the like. The mask layer 210 may be deposited doped or undoped. For example, in some embodiments the mask layer 210 includes polysilicon deposited undoped by low-pressure chemical vapor deposition (LPCVD). The polysilicon may also be deposited by, for example, furnace deposition of an in-situ doped polysilicon. Alternatively, the mask layer 210 may includes other suitable materials.

Figure 3:
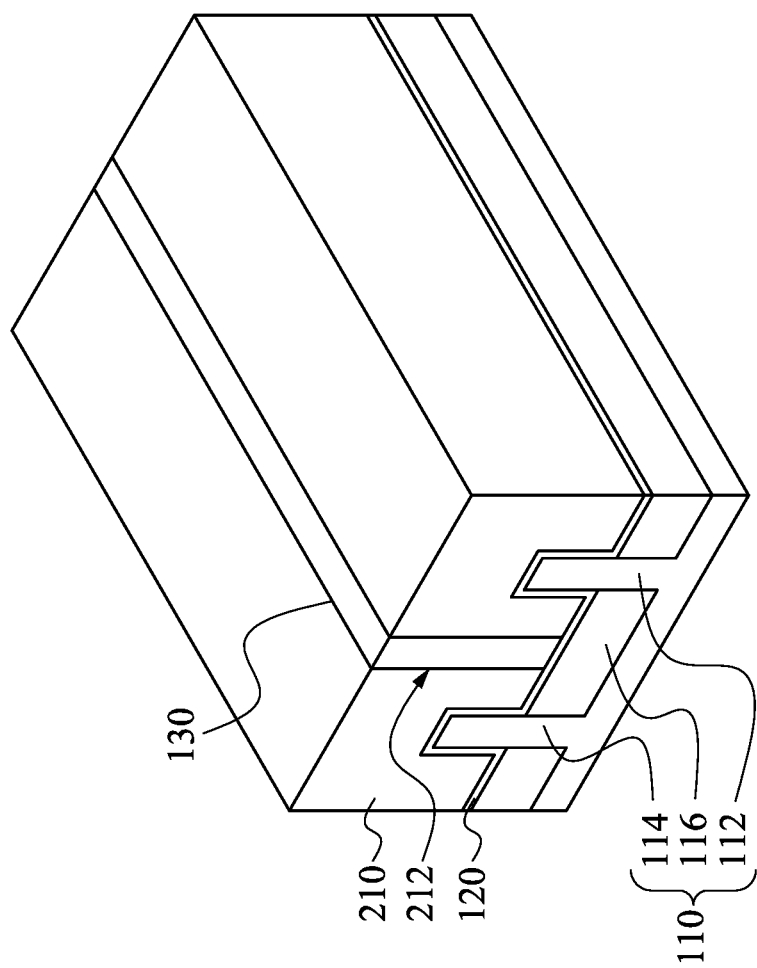

In FIG. 3, a gap 212 may be formed between the first fin 112 and the second fin 114 by, for example, patterning and etching the mask layer 210 using photolithography techniques. In some embodiments, a layer of photoresist material (not shown) is formed over the mask layer 210. The layer of photoresist material is irradiated (or exposed) in accordance with a pattern (the gap 212) and developed to remove a portion of the photoresist material. The remaining photoresist material protects the underlying material from subsequent processing steps, such as etching. Then, an etching process is performed to form the gap 212.

Embodiments of this disclosure are not limited thereto. In some embodiments, a trilayer microlithographic process may be used here. Specifically, the mask layer 210 may be made of a $SiC_xH_yO_z$ material, and the mask layer 210 may be formed by spin coating. Before the gap 212 is formed between the first fin 112 and the second fin 114, a layer of photoresist material (not shown) is formed over the mask layer 210. Then, the layer of photoresist material is irradiated (or exposed) in accordance with a pattern (the gap 212) and developed to remove a portion of the photoresist material. The remaining photoresist material protects the underlying material from subsequent processing steps, such as etching. Then, the mask layer 210 may be etched to form the gap 212 by deep ultraviolet or by fluorine-base RIE (reactive-ion etching).

In some other embodiments, the mask layer 210 may be made of a $C_xH_yO_z$ material. Before the gap 212 is formed between the first fin 112 and the second fin 114, a middle layer (not shown) is formed over the mask layer 210, and then a layer of photoresist material (not shown) is formed over the middle layer, in which the middle layer may be made of a $SiC_xH_yO_z$ material and may be formed by spin coating. Then, the layer of photoresist material is irradiated (or exposed) in accordance with a pattern (the gap 212) and developed to remove a portion of the photoresist material. The remaining photoresist material protects the underlying material from subsequent processing steps, such as etching. Then, the middle layer may be etched by deep ultraviolet or by fluorine-base RIE, and then the pattern of the middle layer may be transferred to the mask layer 210 to form the gap 212 by irradiation and development.

Briefly, the mask layer 210 may be made of a photoresist material in some embodiments, but the mask layer 210 and the layer of photoresist material used to define the gap 212 may be made of different materials.

Then, an insulating structure 130 is formed in the gap 212. The insulating structure 130 is present on the insulating layer 120 and between the first fins 112 and the second fins 114. The insulating structure 130 may include, for example, silicon dioxide ($SiO_2$), silicon nitride (SiN), silicon oxynitride (SiON), silicon carbide (SiC), aluminum oxide ($Al_2O_3$), copper oxide ($Cu_xO_y$, x=1 or 2; y=1, 2, or 3), or $M_xO_y$ (M=Ni, Zn, LaMn, or $La_2Cu$; x=1 or 2; y=1, 2, or 3). The insulating structure 130 may be formed using chemical vapor deposition (CVD), physical vapor deposition (PVD), atomic layer deposition (ALD), other suitable processes, or combinations thereof. In addition, in some embodiments, the insulating layer 120 and the isolation structures 116 are made of different materials.

Figure 4:
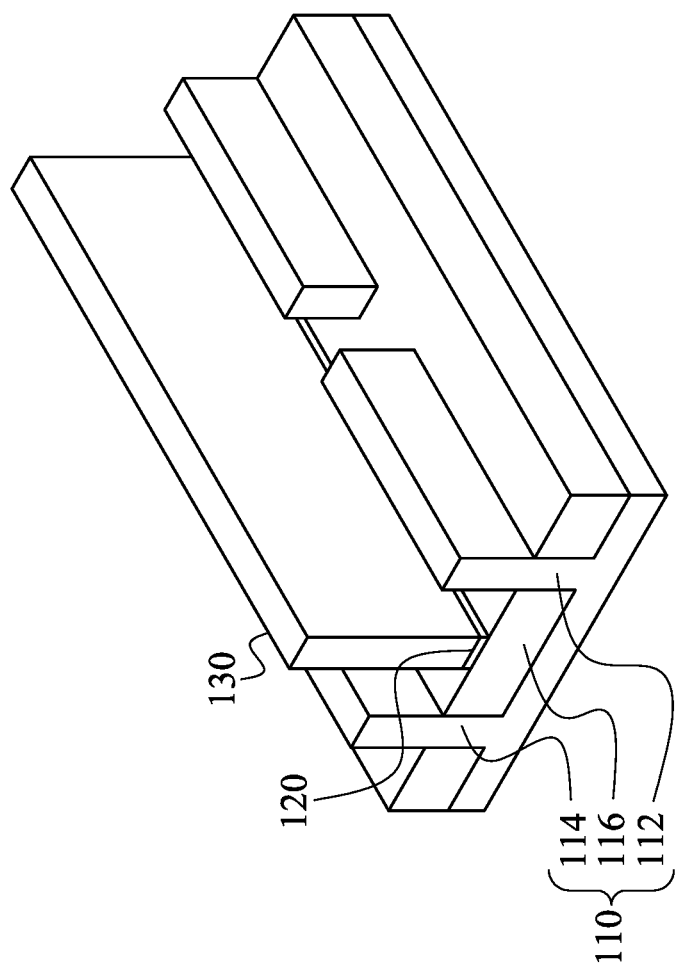

Reference is made to FIG. 3 and FIG. 4. The mask layer 210 is removed by etching, and the insulating layer 120 is also removed by etching while leaving a part of the insulating layer 120 between the isolation structure 116 and the insulating structure 130. In other words, the insulating layer 120 is present between the isolation structure 116 and the insulating structure 130. The insulating layer 120 between the isolation structure 116 and the insulating structure 130 can release stress and/or prevent electrons from tunneling. A ratio of a thickness of the insulating structure 130 and a thickness of the insulating layer 120 is substantially greater than about 10. Specifically, the thickness of the insulating structure 130 is in a range from about 10 nm to about 150 nm, and a width of the insulating structure 130 is in a range from about 15 nm to about 30 nm.

Specifically, when the mask layer 210 is made of a $SiC_xH_yO_z$ material, the mask layer 210 may be etched by deep ultraviolet or by fluorine-base RIE. When the mask layer is made of a $C_xH_yO_z$ material, the mask layer may be etched by irradiation and development.

Figure 5:
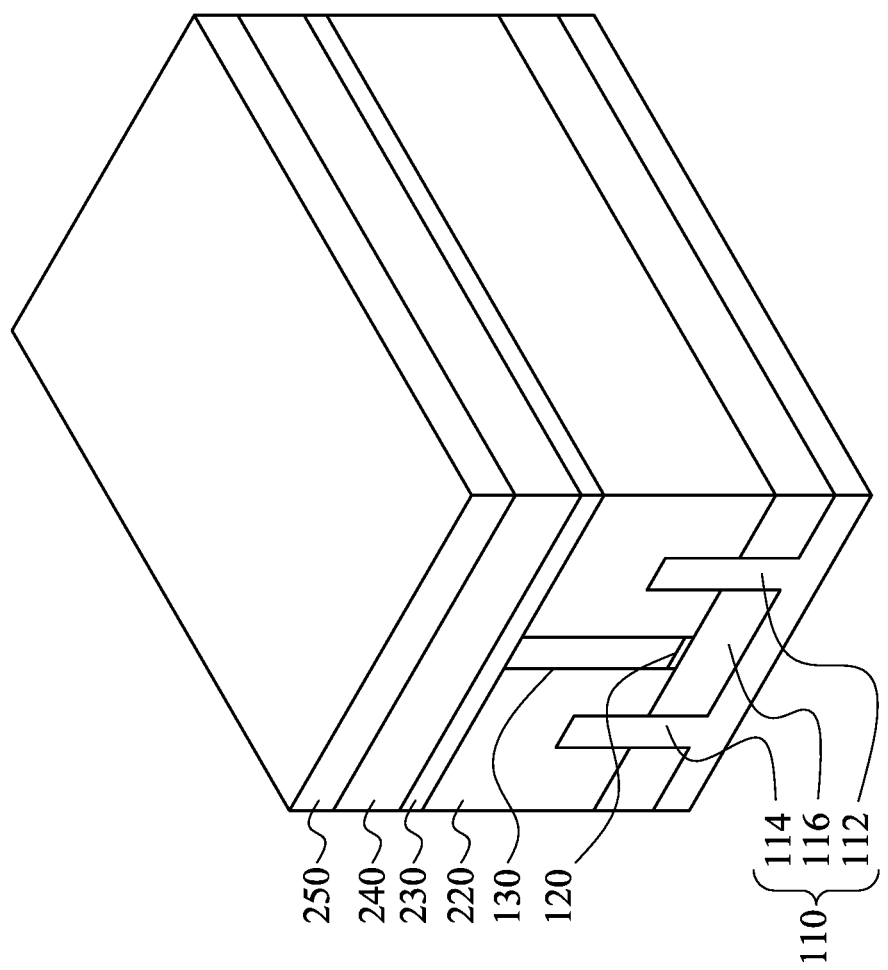

In FIG. 5, a dummy gate layer 220 is formed on the substrate 110. Specifically, the dummy gate layer 220 is deposited and then planarized, such that a height of insulating structure 130 and a height of the dummy gate layer 220 are substantially the same. The dummy gate layer 220 may include, for example, polysilicon, amorphous silicon, or the like. The deposition of the dummy gate layer 220 is performed by chemical vapor deposition (CVD), physical vapor deposition (PVD), other suitable processes, or combinations thereof. The planarization of the dummy gate layer 220 is performed by chemical mechanical polishing.

Then, a stop layer 230 is formed on the dummy gate layer 220 and the insulating structure 130. The stop layer 230 may include, for example, silicon nitride, titanium nitride, or the like. The stop layer 230 may be formed using chemical vapor deposition (CVD), physical vapor deposition (PVD), atomic layer deposition (ALD), other suitable processes, or combinations thereof.

Then, a hard mask layer 240 is formed on the stop layer 230. The hard mask layer 240 may include, for example, silicon dioxide ($SiO_2$), silicon nitride (SiN), oxynitrides (SiON), silicon carbide (SiC), aluminum oxide ($Al_2O_3$), copper oxide ($Cu_xO_y$, x=1 or 2; y=1, 2, or 3), or $M_xO_y$ (M=Ni, Zn, LaMn, or $La_2Cu$; x=1 or 2; y=1, 2, or 3). The stop layer 230 may be formed using chemical vapor deposition (CVD), physical vapor deposition (PVD), other suitable processes, or combinations thereof.

Figure 6:
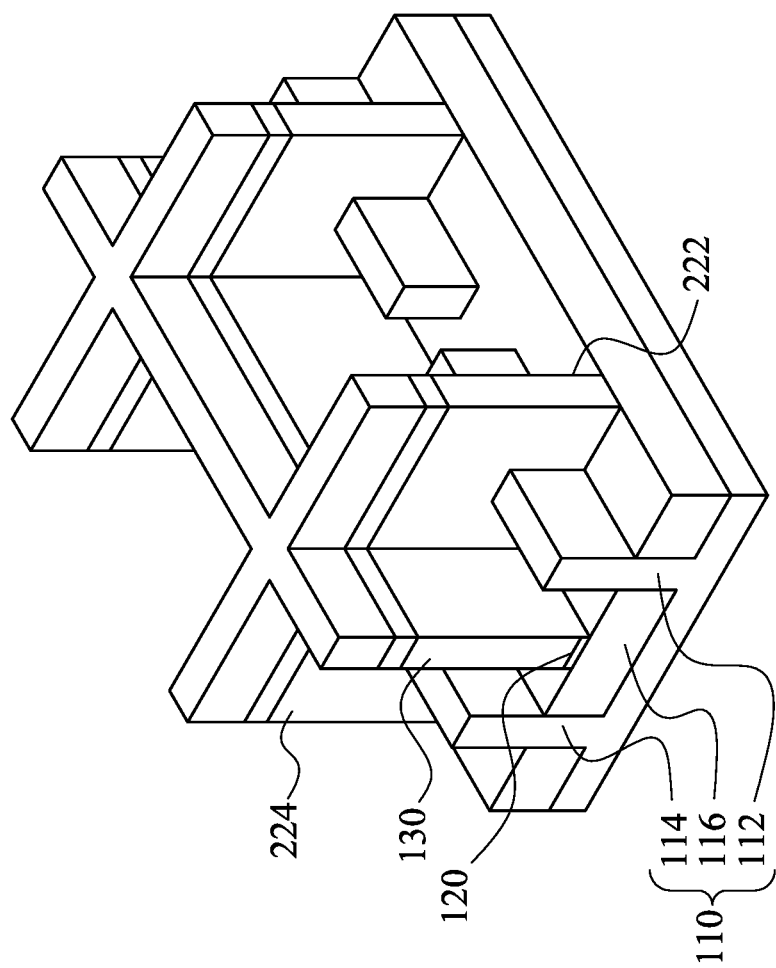

Then, a bottom layer 250 is formed on the hard mask layer 240. The bottom layer 250 may include, for example, a $C_xH_yO_z$ material. Then, as shown in FIG. 5 and FIG. 6, a trilayer microlithographic process may be used here to form first dummy gates 222 and second dummy gates 224.

Specifically, a middle layer is deposited over the bottom layer 250, and a layer of photoresist material (not shown) is formed over the middle layer, in which the middle layer may be made of a $SiC_xH_yO_z$ material and may be formed by spin coating. Then, the layer of photoresist material is irradiated (exposed) in accordance with a pattern (the first dummy gates 222 and the second dummy gates 224) and developed to remove a portion of the photoresist material. The remaining photoresist material protects the underlying material from subsequent processing steps, such as etching. Then, the middle layer may be etched by deep ultraviolet or by fluorine-base RIE, and then the pattern of the middle layer is transferred to the bottom layer 250. Subsequently, the dummy gate layer 220, the stop layer 230, and the hard mask layer 240 are patterned and etched to form the first dummy gates 222 and the second dummy gates 224 at opposite sides of the insulating structure 130, in which the first dummy gates 222 and the second dummy gates 224 are respectively at least partially present on the first fins 112 and second fins 114. After the first dummy gates 222 and the second dummy gates 224 are formed, the bottom layer 250 is removed by etching.

In some other embodiment, the bottom layer 250 may include, for example, polysilicon, amorphous silicon, or the like. The bottom layer 250 may be formed using chemical vapor deposition (CVD), physical vapor deposition (PVD), atomic layer deposition (ALD), other suitable processes, or combinations thereof. Then, instead of using a trilayer microlithographic process, a simple microlithographic process may be used here. Specifically, a layer of photoresist material (not shown) is formed over the bottom layer 250. The layer of photoresist material is irradiated (or exposed) in accordance with a pattern (the first dummy gates 222 and the second dummy gates 224) and developed to remove a portion of the photoresist material. The remaining photoresist material protects the underlying material from subsequent processing steps, such as etching. Then, an etching process is performed to form the first dummy gates 222 and the second dummy gates 224. After the first dummy gates 222 and the second dummy gates 224 are formed, the bottom layer 250 is removed by etching. In yet some other embodiments using a simple microlithographic process, the bottom layer 250 may not be formed.

Figure 7:
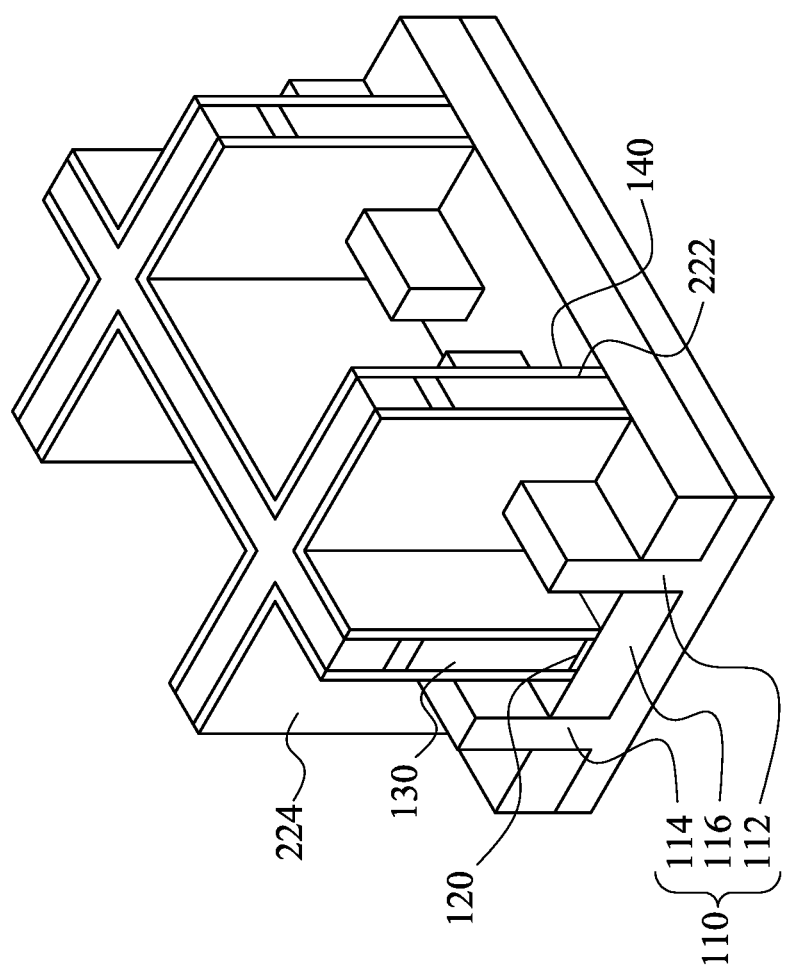

Reference is made to FIG. 7. Spacers 140 are formed on side walls of the first dummy gates 222 and the second dummy gates 224 and side walls of the insulating structure 130. In some embodiments, at least one of the spacers 140 include one or more layers, including silicon nitride, silicon oxynitride, silicon oxide, or other dielectric materials. The available formation methods include plasma enhanced chemical vapor deposition (PECVD), low-pressure chemical vapor deposition (LPCVD), sub-atmospheric chemical vapor deposition (SACVD), and other deposition methods.

Figure 8:
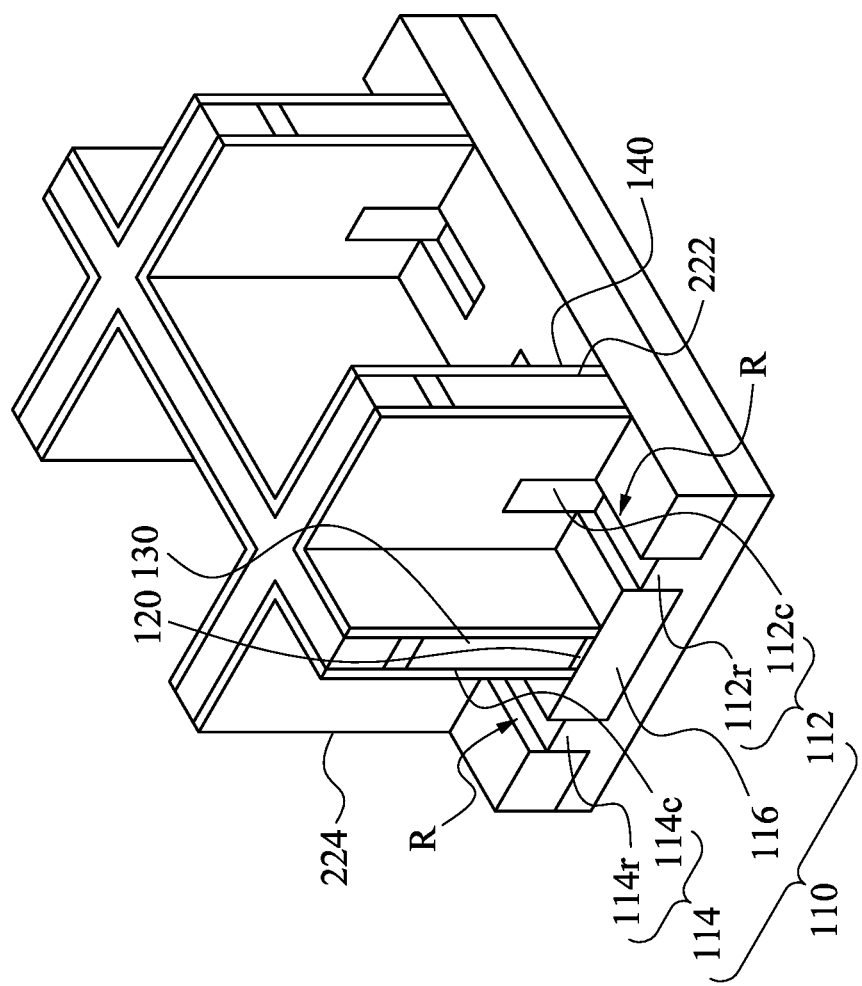

Reference is made to FIG. 8. Portions of the first fins 112 and the second fins 114 exposed by the spacers 140, the first dummy gates 222, and the second dummy gates 224 are partially removed (or partially recessed) to form recesses R in the first fins 112 and the second fins 114. In some embodiments, side walls of the recesses R are substantially vertically parallel to each other. In some other embodiments, the recesses R are formed with a non-vertical parallel profile.

At least one of the first fins 112 includes at least one channel portion 112c and at least one recessed portion 112r. The first dummy gates 222 and the spacers 140 cover the channel portions 112c, and the recesses R are formed on the recessed portions 112r. At least one of the second fins 114 includes at least one channel portion 114c and at least one recessed portion 114r. The second dummy gates 224 and the spacers 140 cover the channel portions 114c, and the recesses R are formed on the recessed portion 114r.

The recessing process may include a dry etching process, a wet etching process, and/or combinations thereof. The recessing process may also include a selective wet etching process or a selective dry etching process. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include $NH_4OH$, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 9:
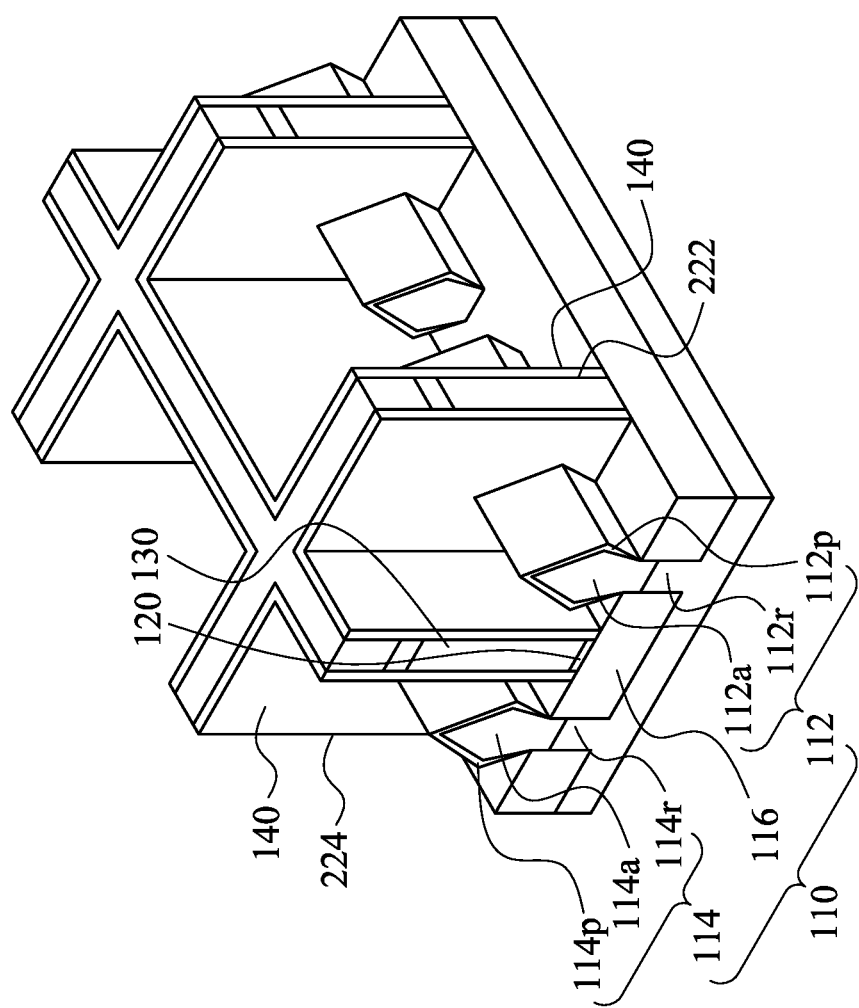

Reference is made to FIG. 9. A plurality of epitaxy structures 112a are respectively formed in the recesses R (see FIG. 8) and on the recessed portions 112r of the first fins 112, and a plurality of epitaxy structures 114a are respectively formed in the recesses R and on the recessed portions 114r of the second fins 114. The epitaxy structures 112a and 114a protrude from the recesses R. In some embodiments, lattice constants of the epitaxy structures 112a and 114a are different from lattice constants of the channel portions 112c and 114c (see FIG. 8) of the first fins 112 and the second fins 114, and thus the channel portions 112c and 114c are strained or stressed to enhance carrier mobility of the semiconductor device and the device performance. The epitaxy structures 112a and 114a may be formed using a cyclic deposition and etching (CDE) process. The CDE process includes an epitaxial deposition/partial etch process and repeating the epitaxial deposition/partial etch process at least once.

In some embodiments that the resulting metal-oxide-semiconductor (MOS) device is an nMOS device, the epitaxy structures 112a and 114a may be n-type epitaxy structures. In some embodiments that the resulting MOS device is an pMOS device, the epitaxy structures 112a and 114a may be p-type epitaxy structures. The n-type epitaxy structures may be made of SiP, SiC, SiPC, Si, III-V compound semiconductor materials or combinations thereof, and the p-type epitaxy structures may be made of SiGe, SiGeC, Ge, Si, III-V compound semiconductor materials, or combinations thereof. During the formation of the n-type epitaxy structures, n-type impurities such as phosphorous or arsenic may be doped with the proceeding of the epitaxy. For example, when the n-type epitaxy structures include SiC or Si, n-type impurities are doped. Moreover, during the formation of the p-type epitaxy structures, p-type impurities such as boron or $BF_2$ may be doped with the proceeding of the epitaxy. For example, when the p-type epitaxy structures includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the first fins 112 and the second fins 114 (e.g., silicon). Thus, a strained channel can be achieved to increase carrier mobility and enhance device performance. The epitaxy structures 112a and 114a may be in-situ doped. If the epitaxy structures 112a and 114a are not in-situ doped, a second implantation process (i.e., a junction implant process) is performed to dope the epitaxy structures 112a and 114a. One or more annealing processes may be performed to activate the epitaxy structures 112a and 114a. The annealing processes include rapid thermal annealing (RTA) and/or laser annealing processes. In some embodiments, silicon caps 112p and 114p may be formed covering the epitaxy structures 112a and 114a. The silicon caps 112p and 114p may be made of undoped polysilicon or undoped amorphous silicon. The silicon caps 112p and 114p may be formed by ALD, CVD, plasma-enhanced chemical vapor deposition (PECVD), high density chemical vapor deposition (HDCVD), PVD, and the like.

Therefore, the first fins 112 with a new form, which include the channel portions 112c (see FIG. 7), the recessed portions 112r, and the epitaxy structures 112a, are formed, and the second fins 114 with a new form, which include the channel portions 114c (see FIG. 7), the recessed portions 114r, and the epitaxy structures 114a, are formed.

Figure 10:
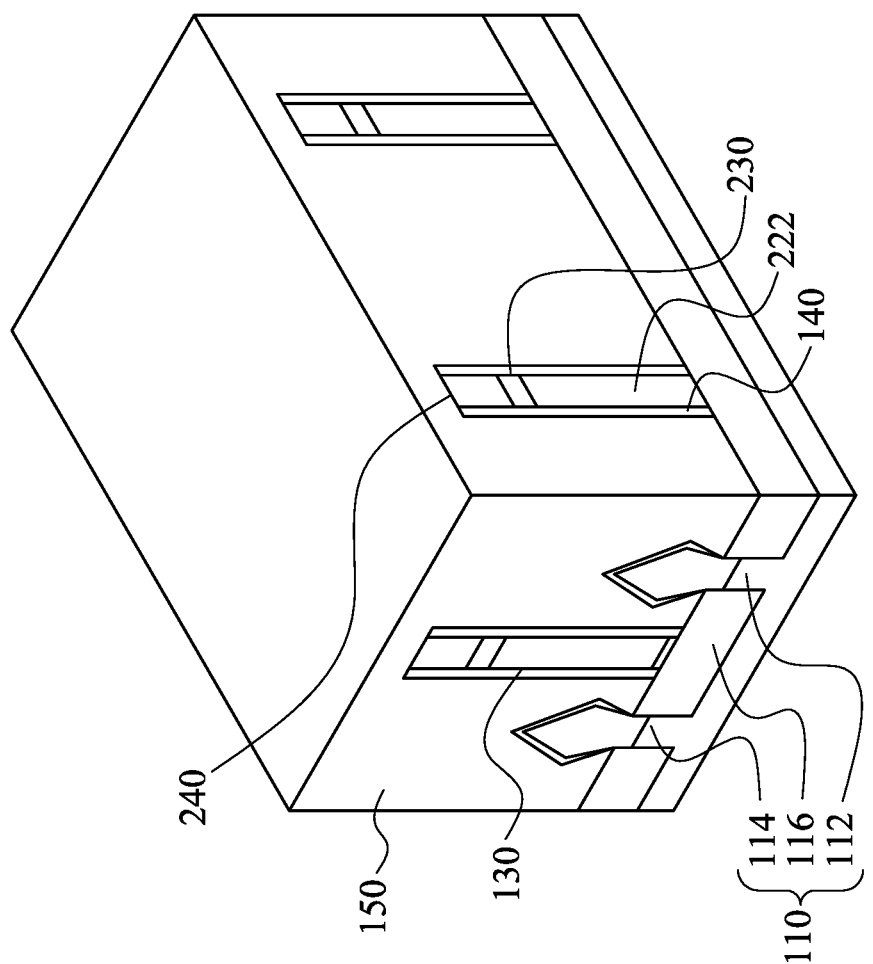

As shown in FIG. 10. An inter-layer dielectric (ILD) 150 is form over the substrate 110 and covers the first dummy gate 222, the second dummy gate 224, and the insulating structure 130. The ILD 160 may include a flowable dielectric material formed using, for example, flowable chemical vapor deposition (FCVD). The ILD 150 may also be a spin-on glass formed using spin-on coating. For example, the ILD 150 may include phospho-silicate glass (PSG), boro-silicate glass (BSG), boron-doped phospho-silicate glass (BPSG), tetraethyl orthosilicate (TEOS) oxide, TiN, SiOC, or other low-k non-porous dielectric materials.

Figure 11:
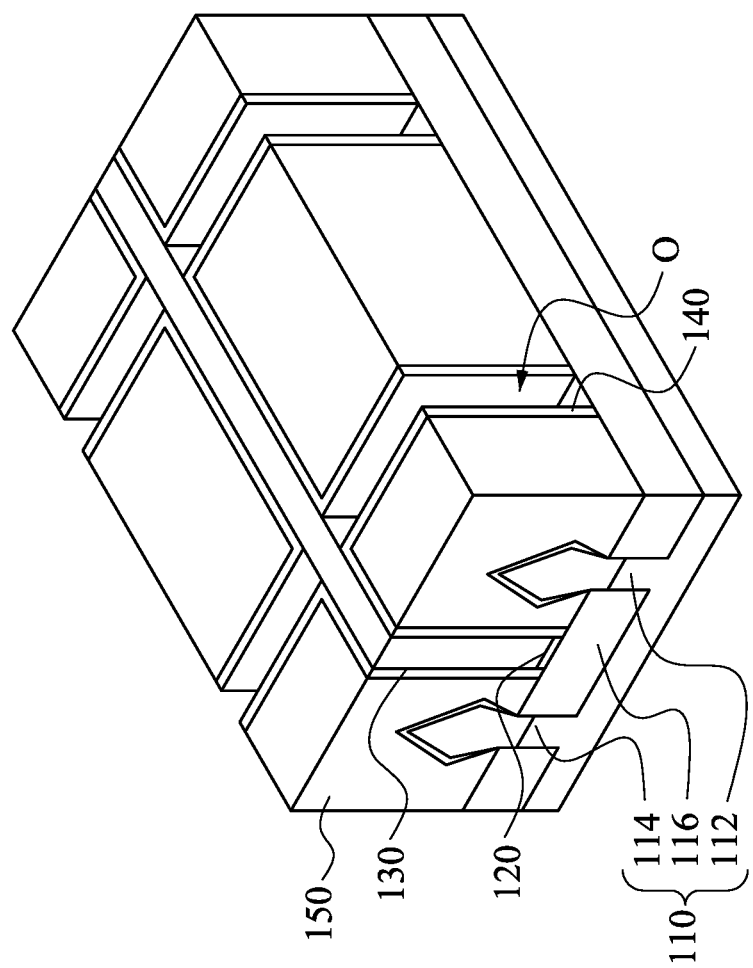

Reference is made to FIG. 10 and FIG. 11, a planarization step is performed by, for example, chemical mechanical polishing (CMP). The CMP is performed to remove excess portions of the ILD 150, the remaining hard mask layer 240, the remaining stop layer 230, and excess portions of the spacers 140, in which excess portions of the ILD 150 and the spacers 140 are over the top surfaces of the first dummy gates 222, the second dummy gates 224, and the insulating structure 130. In other words, the CMP stops on the top surfaces of the first dummy gates 222, the second dummy gates 224, and the insulating structure 130.

Then, the first dummy gates 222 and the second dummy gates 224 are removed.

Openings O are formed as a result of the removal of the first dummy gates 222 and the second dummy gates 224. After the removal of the first dummy gates 222 and the second dummy gates 224, parts of side walls of the insulating structure 130 are exposed by the spacers 140.

Figure 12:
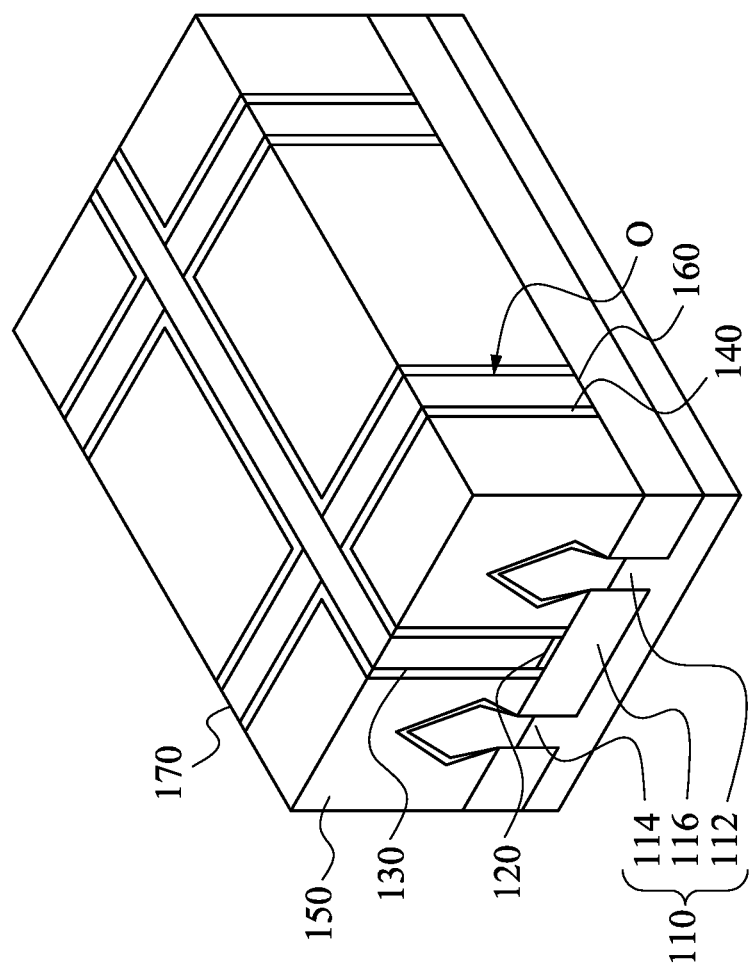

Reference is made to FIG. 11 and FIG. 12. First gates 160 and second gates 170 are formed in the openings O, such that the first gates 160 are present on the first fins 112, and the second gates 170 are present on the second fins 114. In other words, the first dummy gates 222 (see FIG. 10) and the second dummy gates 224 (see FIG. 10) are replaced respectively with the first gates 160 and the second gates 170. Then, the first gates 160 and the second gates 170 are disposed at opposite sides of the insulating structure 130, and the spacers 140 are present on side walls of the first gates 160 and the second gates 170. In addition, the spacers 140 are substantially absent between the insulating structure 130 and the first gates 160 and between the insulating structure 130 and the second gates 170. In other words, the end surfaces of the first gates 160 and the second gates 170 facing the insulating structure 130 are uncovered by the spacers 140, and the insulating structure 130 is in contact with the first gates 160 and the second gates 170.

Specifically, in some embodiments, a gate dielectric layer, a diffusion barrier layer, a metal layer, a block layer, a wetting layer, and a filling metal are sequentially formed in the openings O. Then, a planarization step (for example, chemical mechanical polish (CMP)) is performed to remove excess portions of the gate dielectric layer, the diffusion barrier layer, the metal layer, the block layer, the wetting layer, and the filling metal, in which the excess portions are over the ILD 150. Therefore, the remaining portions of the gate dielectric layer, the diffusion barrier layer, the metal layer, the block layer, the wetting layer, and the filling metal form the first gates 160 and the second gates 170. In other words, at least one of the first gates 160 and the second gates 170 may include the gate dielectric layer, the diffusion barrier layer, the metal layer, the block layer, the wetting layer, and the filling metal.

In some embodiments, the gate dielectric layer includes an interfacial layer (IL, the lower part of the gate dielectric layer), which is a dielectric layer. In some embodiments, the IL includes an oxide layer, such as a silicon oxide layer, which may be formed through a thermal oxidation of the substrate 110, a chemical oxidation, or a deposition step. The gate dielectric layer may also include a high-k dielectric layer (the upper part of the gate dielectric layer) including a high-k dielectric material, such as hafnium oxide, lanthanum oxide, aluminum oxide, or combinations thereof. The dielectric constant (k-value) of the high-k dielectric material is higher than about 3.9, and may be higher than about 7, and sometimes as high as about 21 or higher. The high-k dielectric layer is overlying, and may contact, the IL.

In some embodiments, the diffusion barrier layer includes TiN, TaN, or combinations thereof. For example, the diffusion barrier layer may include a TiN layer (the lower part of the diffusion barrier layer), and a TaN layer (the upper part of the diffusion barrier layer) over the TiN layer.

When the first gates 160 or the second gates 170 form n-type metal-oxide-semiconductor (MOS) devices, the metal layer is in contact with the diffusion barrier layer. For example, in the embodiments in which the diffusion barrier layer includes a TiN layer and a TaN layer, the metal layer may be in physical contact with the TaN layer. In alternative embodiments in which the first gates 160 or the second gates 170 form p-type metal-oxide-semiconductor (MOS) devices, an additional TiN layer is formed between, and in contact with, the TaN layer (in the diffusion barrier layer) and the overlaying metal layer. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer is an n-metal having a work function lower than about 4.3 eV. The work function of the metal layer may also be in a range from about 3.8 eV to about 4.6 eV. The metal layer may include titanium aluminum (TiAl) (which may include, or free from or substantially free from other elements) in accordance with some embodiments. The formation of the metal layer may be achieved through physical vapor deposition (PVD). In accordance with some embodiments of the present disclosure, the metal layer is formed at room temperature (for example, from about 20° C. to about 25° C.). In alternative embodiments, the metal layer is formed at an elevated temperature higher than the room temperature, for example, higher than about 200° C.

The block layer may include TiN in some embodiments. The block layer may be formed using atomic layer deposition (ALD).

The wetting layer has an ability to adhere (and wet) the subsequently formed filling metal during the reflow of the filling metal. In some embodiments, the wetting layer is a cobalt layer, which may be formed using atomic layer deposition (ALD) or chemical vapor deposition (CVD).

The filling metal may include aluminum, an aluminum alloy (e.g., titanium aluminum), tungsten, or copper, which may also be formed using physical vapor deposition (PVD), chemical vapor deposition (CVD), or the like. The filling metal may be reflowed to fully fill the remaining openings O. The formation of the wetting layer improves the wetting of the filling metal to the underlying layers.

In some embodiments, when the mask layer 210 and the dummy gate layer 220 are made of the same material, for example, polysilicon, the mask layer 210 may not be removed after the insulating structure 130 is formed. Instead, the mask layer 210 is directly used as the dummy gate layer 220 of FIG. 5. Since the mask layer 210 is not removed, the insulating layer 120 is not removed as well after the insulating structure 130 is formed. However, the insulating layer 120 is removed when the dummy gate layer 220 is patterned as shown in FIG. 6 and when the first dummy gates 222 and the second dummy gates 224 are removed as shown in FIG. 11, while leaving the part of the insulating layer 120 between the isolation structure 116 and the insulating structure 130. Therefore, the resulting structure of the semiconductor structure 100 is substantially the same as that of the semiconductor structure 100 in the aforementioned embodiments.

In some embodiments of the present disclosure, the insulating structure 130 is formed before the first gates 160 and the second gates 170 are formed. Therefore, even if a gap between the first gates 160 and the second gates 170 is narrow, the insulating structure 130 can still be formed to isolate the first gates 160 and the second gates 170. Furthermore, during formation of the first gates 160 and the second gates 170, the insulating structure 130 has been formed, and thus the first gates 160 and the second gates 170 can be formed without concern about bridging the first gates 160 and the second gates 170.

According to some embodiments of the present disclosure, a semiconductor structure includes a first fin, a second fin, a first gate, a second gate, at least one spacer, and an insulating structure. The first gate is present on the first fin. The second gate is present on the second fin. The spacer is present on at least one side wall of at least one of the first gate and the second gate. The insulating structure is present between the first fin and the second fin, in which the spacer is substantially absent between the insulating structure and said at least one of the first gate and the second gate.

According to some embodiments of the present disclosure, a semiconductor structure includes at least one fin, at least one gate, at least one isolation structure, an insulating structure, and at least one insulating layer. The gate is present on the fin. The isolation structure is present adjacent to the fin. The insulating structure is present on the isolation structure. The insulating layer is present between the insulating structure and the isolation structure, in which the insulating layer and the insulating structure are made of different materials.

According to some embodiments of the present disclosure, a method for manufacturing a semiconductor structure includes the following steps. A mask layer is formed to cover a first fin and a second fin. The mask layer is patterned to form a gap between the first fin and the second fin. An insulating structure is formed in the gap. First and second gates are formed at opposite sides of the insulating structure, in which the first and second gates are respectively at least partially present on the first and second fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first fin and a second fin extending from a substrate;

depositing an insulating layer over the first fin and the second fin;

depositing a mask layer over the insulating layer;

etching the mask layer between the first fin and the second fin;

forming an insulating structure in the mask layer over the insulating layer and between the first fin and the second fin;

removing the mask layer;

forming a first dummy gate structure over the first fin after forming the insulating structure;

removing the first dummy gate structure; and after removing the first dummy gate structure, forming a first gate over the first fin.

2. The method of claim 1, further comprising forming a spacer along a sidewall of the first dummy gate structure, a sidewall of the insulating structure, and a sidewall of the insulating layer.

3. The method of claim 1, wherein the first dummy gate structure is formed along a sidewall of the insulating layer and a sidewall of the insulating structure.

4. The method of claim 1, further comprising forming a shallow trench isolation region on the substrate and surrounding the first fin and the second fin, wherein the insulating layer is deposited on the shallow trench isolation region.

5. The method of claim 1, wherein the insulating structure comprises a metal oxide.

6. The method of claim 1, wherein the insulating layer comprises silicon nitride.

7. A method, comprising:
depositing an insulating layer on a first fin and a second fin;
depositing a mask layer on the insulating layer;
etching the mask layer to form an opening exposing the insulating layer between the first fin and the second fin;
filling the opening with an insulating structure, wherein the insulating structure is on a first portion of the insulating layer, and wherein the mask layer is on a second portion of the insulating layer;
removing the mask layer and the second portion of the insulating layer;
forming a sacrificial structure on the first fin;
forming a dielectric layer on a sidewall of the sacrificial structure, a sidewall of the insulating structure, and a sidewall of the insulating layer;
removing the sacrificial structure; and
forming a gate structure over the first fin and adjacent to the dielectric layer.

8. The method of claim 7, further comprising etching the first fin using the dielectric layer and the sacrificial structure as masks.

9. The method of claim 8, further comprising forming a first epitaxy structure over the first fin, wherein the first epitaxy structure contacts the dielectric layer.

10. The method of claim 9, further comprising forming a first silicon cap layer over the first epitaxy structure, wherein the first silicon cap layer contacts the dielectric layer.

11. The method of claim 7, further comprising forming an interlayer dielectric on the first fin, the second fin, the dielectric layer, and the gate structure, wherein the dielectric layer is between the interlayer dielectric and each of the gate structure, the insulating layer, and the insulating structure.

12. The method of claim 11, further comprising planarizing the interlayer dielectric, the dielectric layer, the insulating structure, and the gate structure.

13. The method of claim 7, further comprising forming an interlayer dielectric on the first fin, the second fin, the dielectric layer, and the sacrificial structure, wherein the dielectric layer is between the interlayer dielectric and each of the sacrificial structure, the insulating layer, and the insulating structure, and wherein the sacrificial structure is removed after forming the interlayer dielectric.

14. A method, comprising:
depositing a dielectric layer on a first semiconductor fin and a second semiconductor fin;
forming a mask layer over the dielectric layer;
etching the mask layer to form a gap between the first semiconductor fin and the second semiconductor fin, wherein the gap exposes the dielectric layer;
forming a dielectric fin filling the gap in the mask layer;
after forming the dielectric fin, forming a first dummy gate structure over the first semiconductor fin and forming a second dummy gate structure over the second semiconductor fin;
after forming the dielectric fin, forming a spacer in contact with a side surface of the dielectric layer, and in contact with a side surface of the dielectric fin, wherein the spacer extends along the side surface of the dielectric fin from the first dummy gate structure to the second dummy gate structure;
forming a first epitaxy structure on the first semiconductor fin and a second epitaxy structure on the second semiconductor fin; and
after forming the first epitaxy structure and the second epitaxy structure, replacing the first dummy gate structure and the second dummy gate structure with a first metal gate and a second metal gate.

15. The method of claim 14, wherein the mask layer is formed on a first portion of the dielectric layer, wherein the dielectric fin is formed on a second portion of the dielectric layer.

16. The method of claim 15, further comprising removing the mask layer and the first portion of the dielectric layer, wherein the second portion of the dielectric layer remains after removing the mask layer and the first portion of the dielectric layer.

17. The method of claim 14, wherein the mask layer comprises polysilicon, wherein the dielectric layer comprises silicon nitride, and wherein the dielectric fin comprises an oxide.

18. The method of claim 14, further comprising forming a shallow trench isolation region between the first semiconductor fin and the second semiconductor fin, wherein the dielectric layer is deposited on the shallow trench isolation region.

19. The method of claim 14, further comprising:
etching the first semiconductor fin to form a first recess;
epitaxially depositing the first epitaxy structure in the first recess; and
forming a first silicon cap over the first epitaxy structure.

20. The method of claim 14, wherein the spacer is not present between the dielectric fin and the first metal gate.

* * * * *